(12) United States Patent
Bovington et al.

(10) Patent No.: US 9,923,335 B1
(45) Date of Patent: Mar. 20, 2018

(54) THERMALLY COMPENSATING SPOT-SIZE CONVERTER FOR AN ATHERMAL LASER

(71) Applicant: Oracle International Corporation, Redwood Shores, CA (US)

(72) Inventors: Jock T. Bovington, La Jolla, CA (US); Stevan S. Djordjevic, San Diego, CA (US); Xuezhe Zheng, San Diego, CA (US); Ashok V. Krishnamoorthy, San Diego, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/405,209

(22) Filed: Jan. 12, 2017

Related U.S. Application Data (60) Provisional application No. 62/398,366, filed on Sep. 22, 2016.

(51) Int. Cl.
| | | |
|---|---|---|
| *H01S 5/068* | (2006.01) | |
| *H01S 5/30* | (2006.01) | |
| *H01S 5/22* | (2006.01) | |

(52) U.S. Cl.
CPC ............... *H01S 5/068* (2013.01); *H01S 5/22* (2013.01); *H01S 5/3013* (2013.01)

(58) Field of Classification Search
CPC ........... H01S 5/068; H01S 5/3013; H01S 5/22
See application file for complete search history.

(56) References Cited

U.S. PATENT DOCUMENTS

| | | | |
|---|---|---|---|
| 4,993,032 A | 2/1991 | Bradley | |
| 5,043,991 A | 8/1991 | Bradley | |
| 6,341,138 B1 | 1/2002 | Peters | |
| 2005/0018741 A1 | 1/2005 | Nomaguchi | |
| 2007/0263224 A1* | 11/2007 | Keyser ................... | G01C 19/72 356/461 |
| 2016/0170141 A1* | 6/2016 | Luo ......................... | H01S 5/141 385/14 |

OTHER PUBLICATIONS

Bovington et al.; "Athermal laser design," Opt. Express, vol. 22, No. 16, pp. 19357-19364, Aug. 2014.

(Continued)

*Primary Examiner* — Dung Nguyen
(74) *Attorney, Agent, or Firm* — Park, Vaughan, Fleming & Dowler LLP (57) ABSTRACT

A laser includes a reflective gain medium (RGM) comprising an optical gain material coupled with an associated reflector. The RGM is coupled to a spot-size converter (SSC), which optically couples the RGM to an optical reflector through a silicon waveguide. The SSC converts an optical mode-field size of the RGM to an optical mode-field size of the silicon waveguide. A negative thermo-optic coefficient (NTOC) waveguide is fabricated on top of the SSC. In this way, an optical signal, which originates from the RGM, passes into the SSC, is coupled into the NTOC waveguide, passes through the NTOC waveguide, and is coupled back into the SSC before passing into the silicon waveguide. During operation, the RGM, the spot-size converter, the NTOC waveguide, the silicon waveguide and the silicon mirror collectively form a lasing cavity for the athermal laser. Finally, a laser output is optically coupled to the lasing cavity.

20 Claims, 6 Drawing Sheets

(56) References Cited

OTHER PUBLICATIONS

Cohen et al.; "Reduced temperature sensitivity of the wavelength of a diode laser in a stress-engineered hydrostatic package," Appl. Phys. Lett., vol. 69, No. 4, p. 455, 1996.
Fleming et al.; "Spectral Characteristics of External-Cavity Controlled Semiconductor Lasers," IEEE J. Quantum Electron., vol. 17, No. 1, pp. 44-59, 1981.
Bosc et al.; Temperature and polarisation insensitive Bragg gratings realised on silica waveguide on silicon, Electronics Letters, vol. 33, No. 2, Jan. 1997.
Liu et al.; "Condition for the realization of a temperature-insensitive long-period waveguide grating", Optics Letters, vol. 31, pp. 2716-2718, No. 18, Sep. 15, 2006.

* cited by examiner

THERMALLY COMPENSATING SPOT-SIZE CONVERTER FOR AN ATHERMAL LASER

RELATED APPLICATION

This application claims priority under 35 U.S.C. § 119 to U.S. Provisional Application No. 62/398,366, entitled "Thermally Compensating Spot-size Converter in Athermal Laser" by the same inventors as the instant application, filed on 22 Sep. 2016, the contents of which are incorporated by reference herein in their entirety.

GOVERNMENT LICENSE RIGHTS

This invention was made with U.S. government support under Agreement No. HR0011-08-9-0001 awarded by DARPA. The U.S. government has certain rights in the invention.

FIELD

The disclosed embodiments generally relate to the design of optoelectronic circuits. More specifically, the disclosed embodiments relate to the design of a thermally compensating spot-size converter to facilitate implementation of an athermal laser.

RELATED ART

Silicon photonics is a promising new technology that can potentially provide large communication bandwidth, low latency and low power consumption for inter-chip and intra-chip connections. In order to achieve low-latency, high-bandwidth optical connectivity, a number of optical components are required, including: optical transmitters, optical detectors, optical multiplexers, optical demultiplexers and lasers.

The operating wavelength of many silicon photonic devices depends on the refractive index of a silicon waveguide core, which is a function of ambient temperature. Providing wavelength stability for these optical components presents challenges, which are typically solved by using some type of temperature-control. For dense wavelength-divisional multiplexing (DWDM) links, it is possible to regulate the temperature of thermally sensitive optical components by using heating elements and/or thermoelectric coolers (TECs). It is alternatively possible to loosen the wavelength-spacing requirements for WDM links to allow for natural wavelength drift of the optical components.

Researchers have also investigated designs for thermally insensitive lasers, which can operate without heating elements or TECs. For example, some researchers have investigated the possibility of using the stress-optic effect to compensate for thermal drift. (See D. A. Cohen, M. E. Heimbuch, and L. A. Coldren, "Reduced temperature sensitivity of the wavelength of a diode laser in a stress-engineered hydrostatic package," *Appl. Phys. Lett.*, vol. 69, no. 4, p. 455, 1996.) Other researchers have investigated the possibility of integrating negative thermo-optic coefficient (NTOC) materials into waveguides in a lasing cavity. (See J. Bovington, S. Srinivasan, and J. E. Bowers, "Athermal laser design," *Opt. Express*, vol. 22, no. 16, pp. 19357-64, Aug. 2014.)

In spite of these promising research efforts, no one has successfully demonstrated an athermal laser that operates without some type of heating element inside the lasing cavity. The reason for this is that hybrid lasers that make use of a III-V gain material, which has a wavelength drift of ~80 pm/K, cannot be easily integrated with NTOC waveguides. It is possible to build external cavity lasers, which have large sections of air in the lasing cavity. This can potentially reduce thermal drift by the ratio of the optical path lengths through the III-V gain material and through the air segments. This ratio can be expressed as nl/L, where n is the effective index of the III-V gain material, l is its length and L is the length of the external segment of the lasing cavity. (Note that the refractive index of air in the external segment is 1, so it is dropped from this ratio.) However, commercial systems have not used such external cavity lasers due to their size, reduced efficiency and additional stabilization requirements.

Hence, what is needed is an athermal laser, which does not suffer from the above-described drawbacks of existing athermal lasers.

SUMMARY

The disclosed embodiments relate to a system that implements an athermal laser. This system includes a reflective gain medium (RGM) comprising an optical gain material coupled to a mirror. This RGM is coupled to a spot-size converter (SSC), which optically couples the RGM to an optical reflector through a silicon waveguide. The SSC converts an optical mode-field size of the RGM to an optical mode-field size of the silicon waveguide. Moreover, a negative thermo-optic coefficient (NTOC) waveguide comprised of an NTOC material is fabricated on top of the SSC. In this way, an optical signal, which originates from the RGM, passes into the SSC, is coupled into the NTOC waveguide, passes through the NTOC waveguide, and is coupled back into the SSC before passing through the silicon waveguide to the silicon mirror. During operation, the RGM, the spot-size converter, the NTOC waveguide, the silicon waveguide and the silicon mirror collectively form a lasing cavity. Finally, a laser output is optically coupled out of the lasing cavity.

In some embodiments, the lasing cavity includes a length $l_{Si}$, through silicon, a length $l_{NTOC}$ through the NTOC material, a length $l_{OGM}$ through the optical gain material and a negligible length through the SSC, wherein the effective refractive index of silicon is $n_{Si}$, the effective refractive index of the NTOC material is $n_{NTOC}$, and the effective refractive index of the optical gain material is $n_{OGM}$. Moreover, the effective thermo-optic coefficient (TOC) of silicon is $dn_{Si}/dT$, the effective TOC of the NTOC material is $dn_{NTOC}/dT$, and the effective TOC of the optical gain material is $dn_{OGM}/dT$. Finally, $l_{NTOC} \approx l_{OGM} * (dn_{OGM}/dT - dn_{Si}/dT)/(dn_{Si}/dT - dn_{NTOC}/dT)$, whereby the effective TOC of the portion of the lasing cavity that passes through the optical gain material and the NTOC material is substantially the same as the TOC of silicon.

In some embodiments, the silicon mirror comprises a microring mirror.

In some embodiments, the silicon mirror comprises a distributed Bragg reflector (DBR).

In some embodiments, the silicon mirror is a tunable silicon mirror, which includes a thermal-tuning mechanism.

In some embodiments, the silicon mirror is an athermal silicon mirror, which includes a cladding of the NTOC material.

In some embodiments, a bottom surface of the NTOC, which is in contact with the SSC, is clad with a low-index dielectric material. Moreover, a top surface of the NTOC is covered by one of the following: air, a low-index dielectric material, and a polymer.

In some embodiments, the RGM in located on a gain chip, which is separate from a silicon photonic chip, which includes the silicon waveguide and the silicon mirror.

In some embodiments, the NTOC material comprises titanium dioxide ($TiO_2$).

In some embodiments, the spot-size converter is comprised of silicon oxynitride (SiON), where the nitrogen-to-oxygen ratio may vary.

In some embodiments, the spot-size converter is comprised of stoichiometric or low-stress silicon nitride (SiNx).

In some embodiments, the optical gain material is comprised of a III-V semiconductor.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Throughout this specification, and in the appended claims, we use the term "gain medium" (GM) to refer to any device, which contains active gain material and can be used to power a laser. This can include, but is not limited to: a semiconductor optical amplifier (SOA), an active device fabricated using a quantum-dot gain material, and an active device fabricated in a nonlinear fiber gain medium. We also use the term "reflective gain medium" (RGM) to refer to any type of active gain material, which is coupled to an associated reflector. This can include, but is not limited to: a reflective semiconductor optical amplifier (RSOA), and an SOA that can be accessed through both ends and looped either as: (1) a loop mirror coupled to a reflective end of the SOA, or (2) a loop containing the SOA before the SOA. (This geometry changes the structure to the extent that light passes in a single pass through both directions in the SOA, just like a double pass through an RSOA, and provides gain.) Note that the loop mirror recited above can alternatively be replaced with a distributed Bragg reflector (DBR).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Overview

We present a new design for a III-V/Si hybrid laser, which includes a thermally compensating element that makes the laser's output wavelength stable during temperature variations without the need for a heating element or a thermo-electric cooler (TEC). This thermally compensating element can be implemented as a waveguide comprised of a negative thermo-optic coefficient (NTOC) material, such as $TiO_2$, which is integrated onto a dielectric spot-size converter (SSC) that converts an optical mode-field size of a III-V gain medium to an optical mode-field size of a silicon waveguide in the laser. Note that this new hybrid laser reduces the energy required to maintain wavelength stability, and also decreases the wavelength spacing of associated WDM links.

Details

Recently developed silicon photonic technologies can provide significant advantages for optoelectronic systems, wherein the advantages include lower cost, increased reliability and scalability. For example, a hybrid III-V silicon laser combines energy-efficient compound III-V semiconductor materials with low-cost and reliable silicon-photonic (SiP) mirrors to provide an efficient light source for optical communications. To this end, we have developed a new hybrid III-V silicon laser having an edge-coupled configuration, which includes a spot-size converter (SSC) between III-V material on a gain chip and a silicon waveguide on an SiP chip. This SSC comprises a dielectric material, such as SiNx or SiON, which provides some reduction in the total thermal drift, but cannot totally eliminate the thermal drift.

This thermal drift $d\lambda_C/dT$ can be expressed as specified in equation (1) below as a function of a thermal expansion coefficient $\alpha$, a group index $n_g$, an effective index $n_{eff}$ and a change in the effective index with temperature $dn_{eff}/dT$ of all segments of the lasing cavity.

$$\frac{d\lambda_C}{dT} = \frac{\lambda_C}{\int_{L_C} n_g dL}\left(\alpha_{sub}\int_{L_C} n_{eff} dL + \int_{L_C} \frac{dn_{eff}}{dT} dL\right) \quad (1)$$

Figure 1:
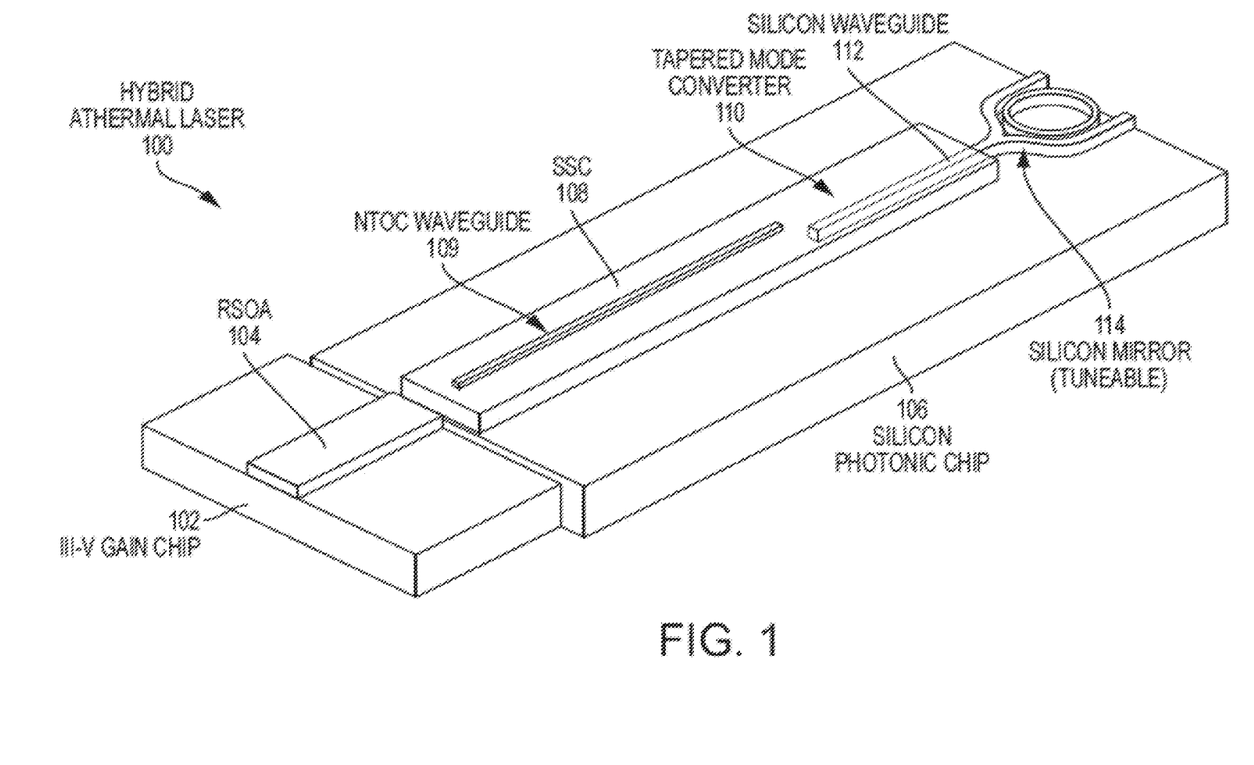
FIG. 1 illustrates an exemplary configuration for an athermal tunable laser in accordance with the disclosed embodiments.

FIG. 1 illustrates an exemplary configuration for this new hybrid athermal laser 100 in accordance with the disclosed embodiments. As illustrated in FIG. 1, this new athermal laser 100 includes a III-V gain chip 102, which contains a reflective semiconductor optical amplifier (RSOA) 104. The III-V gain chip 102 is attached to a silicon photonic chip 106, which includes a silicon waveguide 112 that is coupled to a silicon (Si) mirror 114. Light generated by RSOA 104 is directed into silicon waveguide 112 through a spot-size converter (SSC) 108, which converts the optical mode-field size of RSOA 104 to the optical mode-field size of silicon waveguide 112. SSC 108 is comprised of a material such as SiON or SiNx, which (as mentioned above) provides some reduction in total thermal drift, but cannot completely eliminate thermal drift. In order to eliminate this thermal drift, the new laser design integrates an NTOC waveguide 109 on top of SSC 108. More specifically, NTOC waveguide 109 can comprise a TiO$_2$ core, clad on the bottom by a low-index dielectric and on top either by air or another low-index dielectric or polymer. Also note that a laser output (not shown) is optically coupled to this lasing cavity.

Equation (1) (specified above) can be used to select the length of NTOC waveguide 109, which is comprised of TiO$_2$, as a function of the length of the other segments in the lasing cavity. The longer the RSOA 104 in III-V gain chip 102, the longer the NTOC waveguide 109. Also, the longer the effective length of silicon mirror 114, the longer the length of NTOC waveguide 109. However, in a design where negligible length is given to silicon, which is not athermalized by the TiO$_2$ in NTOC waveguide 109, there is a direct relationship between the length of NTOC waveguide 109 and RSOA 104 in III-V gain chip 102. To a first order, the length of the TiO$_2$ in NTOC waveguide 109 and the length of any silicon or III-V material should be nearly equal owing to their common dn/dT coefficients.

Figure 2:
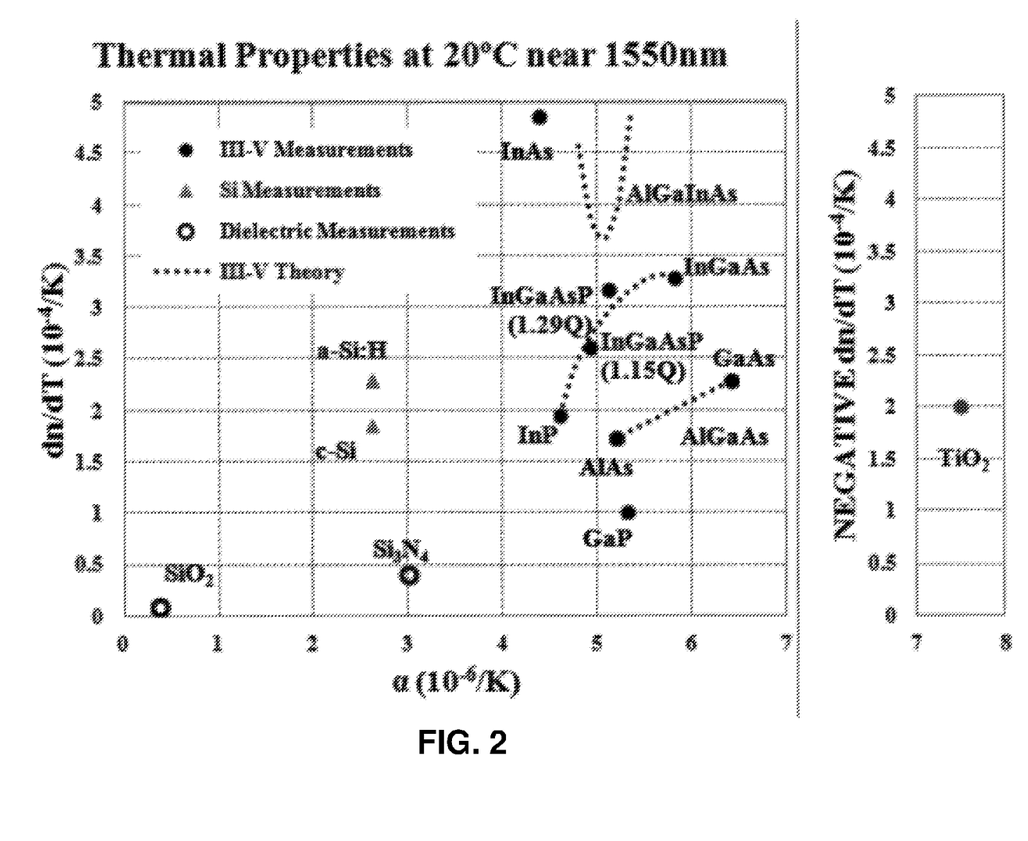
FIG. 2 presents a graph of thermo-optic coefficient versus thermal expansion coefficient for materials that can be used to construct a III-V/Si hybrid laser in accordance with the disclosed embodiments.

Also note that a number of different materials (instead of a III-V semiconductor, SiON or SiNx and TiO$_2$) can be used to implement RSOA 104, SSC 108 and NTOC waveguide 109, respectively. For example, FIG. 2 presents a graph of thermo-optic coefficients versus thermal expansion coefficients for various alternative materials that can be used to implement a III-V/Si hybrid laser in accordance with the disclosed embodiments.

Note that RSOA 104, SSC 108, NTOC waveguide 109, silicon waveguide 112 and silicon mirror 114 collectively form a lasing cavity for the laser 100. During operation of this laser 100, light which is generated by RSOA 104 is directed into SSC 108, which is shaped to receive the mode of RSOA 104. Next, the mode is coupled into NTOC waveguide 109. After passing through NTOC waveguide 109, the mode is converted back to SSC 108 again before coupling to silicon waveguide 112 via a tapered mode converter 110, which provides an inverse taper.

The embodiment of hybrid external laser 100 illustrated in FIG. 1 uses a tunable microring mirror to implement silicon mirror 114. It is advantageous to use such a "tunable" microring mirror 114 because there will be manufacturing variations, which need to be resolved through tuning, and there is also a requirement for mode stability, which can best be solved by locking the microring mirror 114 through continuous tuning to a single cavity mode in a feedback loop.

Figure 3A:
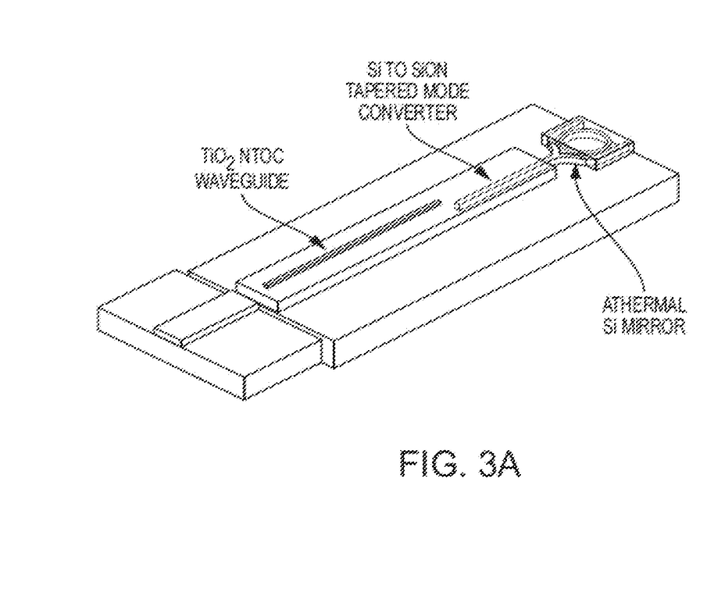
FIG. 3A illustrates an exemplary configuration for a trimmed and athermalized hybrid laser in accordance with the disclosed embodiments.
Figure 3B:
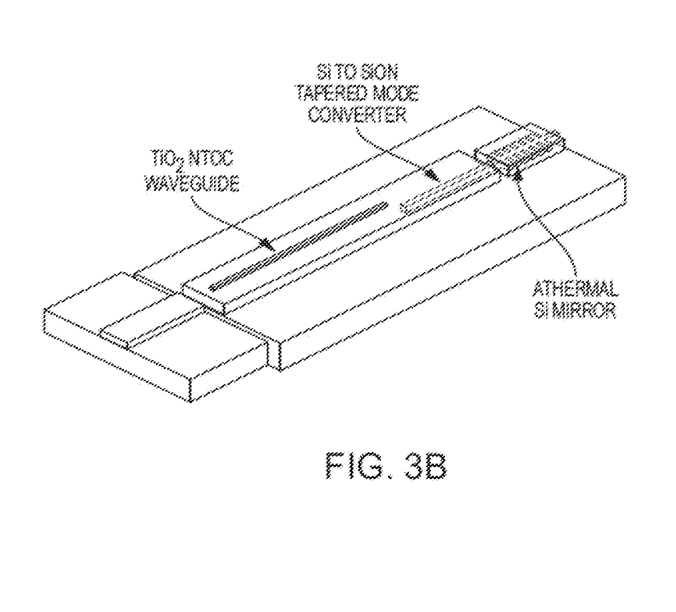
FIG. 3B illustrates another configuration for a trimmed and athermalized hybrid laser in accordance with the disclosed embodiments.
Figure 4A:
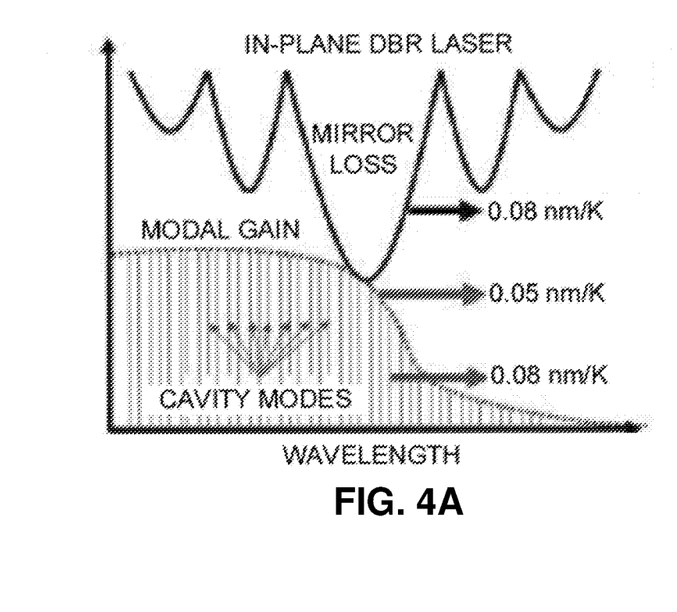
FIG. 4A presents a graph illustrating gain versus wavelength for an in-plane DBR laser in accordance with the disclosed embodiments.
Figure 4B:
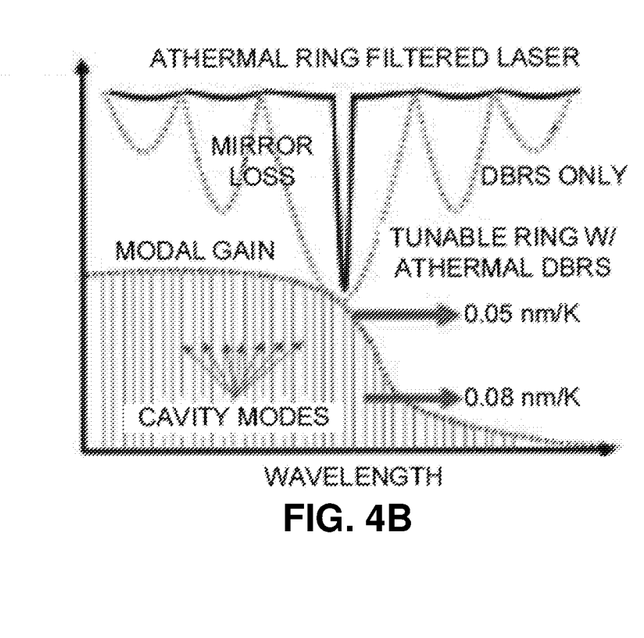
FIG. 4B presents a graph illustrating gain versus wavelength for an athermal ring filtered laser in accordance with the disclosed embodiments.

It is also possible to implement silicon mirror 114 using an "athermal mirror," which is not tunable as is illustrated in FIGS. 3A and 3B. More specifically, FIG. 3A illustrates an athermal silicon mirror comprising a ring filter clad with an NTOC material such as TiO$_2$, and FIG. 3B illustrates an athermal silicon mirror comprised of a distributed Bragg reflector (DBR), which is also clad with an NTOC material. In the embodiments illustrated in FIGS. 3A and 3B, instead of making silicon mirror 114 tunable, the lasing cavity is designed to achieve an athermal character, either by manufacturing tolerance improvements, or through a trimming process, followed by cladding silicon mirror 114 with an NTOC material to facilitate athermalization. Note that making silicon mirror 114 athermal is desirable for a passively athermal design because the drift of the mirror filter and the cavity modes must both be insensitive to temperature to lock the laser wavelength during temperature variations. Admittedly, this does not solve the gain drift issue, but as illustrated by the graphs that appear in FIGS. 4A and 4B, the gain can be designed to drift into the resonance to compensate for the decrease in gain which also accompanies raising temperatures. (Note that FIG. 4A illustrates the gain for the embodiment illustrated in FIG. 3B, which uses a DBR as a silicon mirror. Similarly, FIG. 4B illustrates the gain for the embodiment illustrated in FIG. 3A, which uses a ring filter as a silicon mirror.)

Operation

Figure 5:
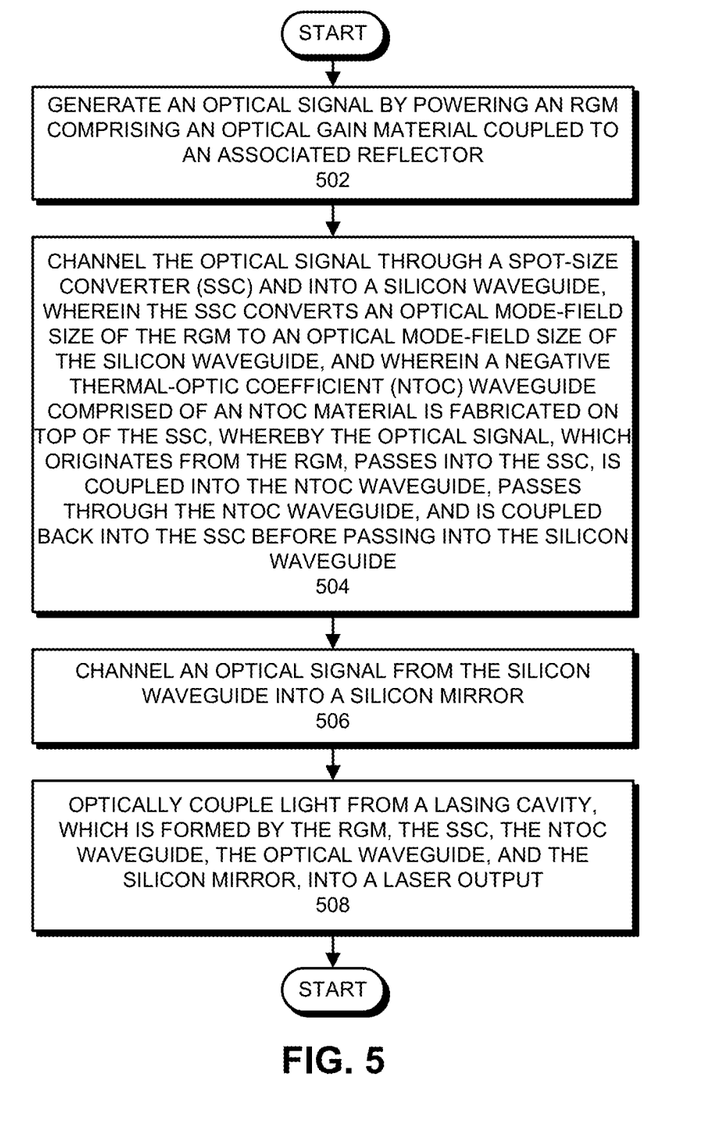
FIG. 5 presents a flow chart describing an optical path through an athermalized hybrid laser in accordance with the disclosed embodiments.

During operation, the athermal laser system described above operates as illustrated in the flow chart that appears in FIG. 5. The system first generates an optical signal by powering a reflective gain medium (RGM) comprising an optical gain material coupled to an associated reflector (step 502). Next, the system channels the optical signal through a spot-size converter (SSC) into a silicon waveguide, wherein the SSC converts an optical mode-field size of the RGM to an optical mode-field size of the silicon waveguide. A negative thermo-optic coefficient (NTOC) waveguide comprised of an NTOC material is fabricated on top of the SSC, whereby the optical signal, which originates from the RGM and passes into the SSC, is coupled into the NTOC waveguide, passes through the NTOC waveguide, and is coupled back into the SSC before passing into the silicon waveguide (step 504). The system then channels the optical signal from the silicon waveguide into a silicon mirror (step 506). Finally, the system optically couples light from a lasing cavity, which is formed by the RGM, the SSC, the NTOC waveguide, the optical waveguide, and the silicon mirror, into a laser output (step 508).

System

Figure 6:
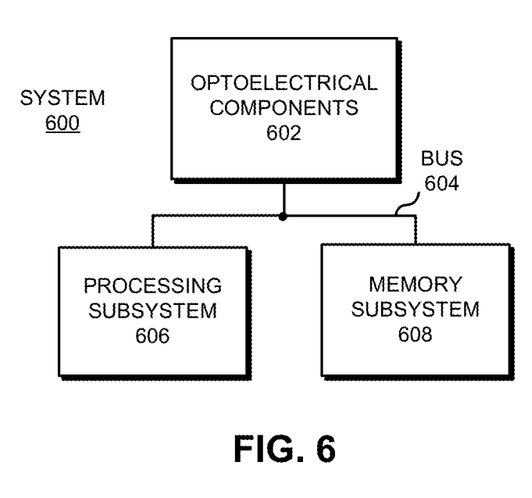
FIG. 6 illustrates a system that incorporates optical components with semiconductor chips in accordance with an embodiment of the present disclosure.

One or more of the preceding embodiments may be included in a system or device. More specifically, FIG. 6 illustrates a system 600 that includes optoelectrical components 602 including one or more hybrid lasers. System 600 also includes a processing subsystem 606 (with one or more processors) and a memory subsystem 608 (with memory).

In general, system 600 may be implemented using a combination of hardware and/or software. Thus, system 600 may include one or more program modules or sets of instructions stored in a memory subsystem 608 (such as DRAM or another type of volatile or non-volatile computer-readable memory), which, during operation, may be executed by processing subsystem 606. Furthermore, instructions in the various modules in memory subsystem 608 may be implemented in: a high-level procedural language, an object-oriented programming language, and/or in an assembly or machine language. Note that the programming language may be compiled or interpreted, e.g., configurable or configured, to be executed by the processing subsystem.

Components in system 600 may be coupled by signal lines, links or buses, for example bus 604. These connections may include electrical, optical, or electro-optical communication of signals and/or data. Furthermore, in the preceding embodiments, some components are shown directly connected to one another, while others are shown connected via intermediate components. In each instance, the method of interconnection, or "coupling," establishes some desired communication between two or more circuit nodes, or terminals. Such coupling may often be accomplished using a number of photonic or circuit configurations, as will be understood by those of skill in the art; for example, photonic coupling, AC coupling and/or DC coupling may be used.

In some embodiments, functionality in these circuits, components and devices may be implemented in one or more: application-specific integrated circuits (ASICs), field-programmable gate arrays (FPGAs), and/or one or more digital signal processors (DSPs). Furthermore, functionality in the preceding embodiments may be implemented more in hardware and less in software, or less in hardware and more in software, as is known in the art. In general, system 600 may be at one location or may be distributed over multiple, geographically dispersed locations.

System 600 may include: a switch, a hub, a bridge, a router, a communication system (such as a wavelength-division-multiplexing communication system), a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, and/or another electronic device.

Moreover, the optoelectrical components 602 can be used in a wide variety of applications, such as: communications (for example, in a transceiver, an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. An athermal laser, comprising:
   a reflective gain medium (RGM) comprising an optical gain material coupled with an associated reflector;
   a silicon waveguide;
   a silicon mirror, which is optically coupled to the silicon waveguide;
   a spot-size converter (SSC), which optically couples the RGM to the silicon waveguide, wherein the SSC converts an optical mode-field size of the RGM to an optical mode-field size of the silicon waveguide;
   a negative thermo-optic coefficient (NTOC) waveguide comprised of an NTOC material fabricated on top of the SSC, whereby an optical signal, which originates from the RGM, passes into the SSC, is coupled into the NTOC waveguide, passes through the NTOC waveguide, and is coupled back into the SSC before passing into the silicon waveguide;
   wherein the RGM, the spot-size converter, the NTOC waveguide, the silicon waveguide and the silicon mirror collectively form a lasing cavity for the athermal laser; and
   a laser output, which is optically coupled out of the lasing cavity.

2. The athermal laser of claim 1, wherein the lasing cavity includes a length $l_{Si}$ through silicon, a length $l_{NTOC}$ through the NTOC material, a length $l_{OGM}$ through the optical gain material, and a negligible length through the SSC;
   wherein the effective refractive index of silicon is $n_{Si}$, the effective refractive index of the NTOC material is $n_{NTOC}$, and the effective refractive index of the optical gain material is $n_{OGM}$;
   wherein the effective thermo-optic coefficient (TOC) of silicon is $dn_{Si}/dT$, the effective TOC of the NTOC material is $dn_{NTOC}/dT$, and the effective TOC of the optical gain material is $dn_{OGM}/dT$; and
   wherein $l_{NTOC} \approx l_{OGM} * (dn_{OGM}/dT - dn_{Si}/dT)/(dn_{Si}/dT - dn_{NTOC}/dT)$, whereby the effective TOC of a portion of the lasing cavity that passes through the optical gain material and the NTOC material is substantially the same as the TOC of silicon.

3. The athermal laser of claim 1, wherein the silicon mirror comprises one of: a microring mirror, and a distributed Bragg reflector (DBR).

4. The athermal mirror of claim 1, wherein the silicon mirror is a tunable silicon mirror, which includes a thermal-tuning mechanism.

5. The athermal laser of claim 1, wherein the silicon mirror is an athermal silicon mirror, which includes a cladding of the NTOC material.

6. The athermal laser of claim 1,
   wherein a bottom surface of the NTOC, which is in contact with the SSC, is clad with a low-index dielectric material; and wherein a top surface of the NTOC is covered by one of the following: air, a low-index dielectric material, and a polymer.

7. The athermal laser of claim 1, wherein the RGM in located on a gain chip that is separate from a silicon photonic chip, which includes the silicon waveguide, and the silicon mirror.

8. The athermal laser of claim 1, wherein the NTOC material comprises titanium dioxide (TiO$_2$).

9. The athermal laser of claim 1, wherein the spot-size converter is comprised of one of the following:
    silicon oxynitride (SiON), wherein the nitrogen-to-oxygen ratio may vary; and
    stoichiometric or low-stress silicon nitride (SiNx).

10. The athermal laser of claim 1, wherein the optical gain material is comprised of a III-V semiconductor.

11. A system, comprising:
    at least one processor;
    at least one memory coupled to the at least one processor; and
    an optical transmitter for communicating optical signals generated by the system, wherein the optical transmitter includes an athermal laser comprising:
        a reflective gain medium (RGM) comprising an optical gain material coupled with an associated reflector;
        a silicon waveguide;
        a silicon mirror, which is optically coupled to the silicon waveguide;
        a spot-size converter (SSC), which optically couples the RGM to the silicon waveguide, wherein the SSC converts an optical mode-field size of the RGM to an optical mode-field size of the silicon waveguide;
        a negative thermo-optic coefficient (NTOC) waveguide comprised of an NTOC material fabricated on top of the SSC, whereby an optical signal, which originates from the RGM, passes into the SSC, is coupled into the NTOC waveguide, passes through the NTOC waveguide, and is coupled back into the SSC before passing into the silicon waveguide;
        wherein the RGM, the spot-size converter, the NTOC waveguide, the silicon waveguide and the silicon mirror collectively form a lasing cavity for the athermal laser; and
        a laser output, which is optically coupled out of the lasing cavity.

12. The system of claim 11, wherein the lasing cavity includes a length $l_{Si}$ through silicon, a length $l_{NTOC}$ through the NTOC material, a length $l_{OGM}$ through the optical gain material, and a negligible length through the SSC;
    wherein the effective refractive index of silicon is $n_{Si}$, the effective refractive index of the NTOC material is $n_{NTOC}$, and the effective refractive index of the optical gain material is $n_{OGM}$;
    wherein the effective thermo-optic coefficient (TOC) of silicon is $dn_{Si}/dT$, the effective TOC of the NTOC material is $dn_{NTOC}/dT$, and the effective TOC of the optical gain material is $dn_{OGM}/dT$; and
    wherein $l_{NTOC} \approx l_{OGM}*(dn_{OGM}/dT - dn_{Si}/dT)/(dn_{Si}/dT - dn_{NTOC}/dT)$,
whereby the effective TOC of a portion of the lasing cavity that passes through the optical gain material and the NTOC material is substantially the same as the TOC of silicon.

13. The system of claim 11, wherein the silicon mirror comprises one of: a microring mirror, and a distributed Bragg reflector (DBR).

14. The system of claim 11, wherein the silicon mirror is a tunable silicon mirror, which includes a thermal-tuning mechanism.

15. The system of claim 11, wherein the silicon mirror is an athermal silicon mirror, which includes a cladding of the NTOC material.

16. The system of claim 11,
    wherein a bottom surface of the NTOC, which is in contact with the SSC, is clad with a low-index dielectric material; and
    wherein a top surface of the NTOC is covered by one of the following: air, a low-index dielectric material, and a polymer.

17. The system of claim 11, wherein the RGM in located on a gain chip, which is separate from a silicon photonic chip that includes the silicon waveguide, and the silicon mirror.

18. The system of claim 11, wherein the NTOC material comprises titanium dioxide (TiO$_2$).

19. The system of claim 11, wherein the spot-size converter is comprised of one of the following:
    silicon oxynitride (SiON), wherein the nitrogen-to-oxygen ratio may vary; and
    stoichiometric or low-stress silicon nitride (SiNx).

20. A method for operating an athermal laser, comprising:
    generating an optical signal by powering a reflective gain medium (RGM) comprising an optical gain material coupled with an associated reflector;
    channeling the optical signal through a spot-size converter (SSC) and into a silicon waveguide, wherein the SSC converts an optical mode-field size of the RGM to an optical mode-field size of the silicon waveguide;
    wherein a negative thermo-optic coefficient (NTOC) waveguide comprised of an NTOC material is fabricated on top of the SSC, whereby the optical signal, which originates from the RGM, passes into the SSC, is coupled into the NTOC waveguide, passes through the NTOC waveguide, and is coupled back into the SSC before passing into the silicon waveguide;
    channeling an optical signal from the silicon waveguide into a silicon mirror; and
    optically coupling light from a lasing cavity, which is formed by the RGM, the SSC, the NTOC waveguide, the optical waveguide, and the silicon mirror, into a laser output.

* * * * *

UNITED STATES PATENT AND TRADEMARK OFFICE
CERTIFICATE OF CORRECTION

PATENT NO. : 9,923,335 B1
APPLICATION NO. : 15/405209
DATED : March 20, 2018
INVENTOR(S) : Bovington et al.

Page 1 of 1

It is certified that error appears in the above-identified patent and that said Letters Patent is hereby corrected as shown below:

In the Specification

Column 3, Line 1, delete "mirror" and insert -- laser --, therefor.

In the Claims

Column 8, Line 58, in Claim 4, delete "in located" and insert -- is located --, therefor.

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*